(12) United States Patent
Lamartine

(10) Patent No.: US 6,583,933 B2
(45) Date of Patent: Jun. 24, 2003

(54) REFLECTIVE DIFFRACTION GRATING

(75) Inventor: Bruce C. Lamartine, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/859,946

(22) Filed: May 16, 2001

(65) Prior Publication Data

US 2003/0076593 A1 Apr. 24, 2003

(51) Int. Cl.[7] .................................................. G02B 5/18
(52) U.S. Cl. .................................. 359/567; 369/109.01
(58) Field of Search ................................ 365/118, 124, 365/125; 359/567, 572; 369/109.01, 275.4

(56) References Cited

U.S. PATENT DOCUMENTS

| | | | |
|---|---|---|---|
| 4,277,138 A | 7/1981 | Dammann | 350/162 |
| 4,405,405 A | 9/1983 | Fujjii et al. | 156/633 |
| 4,701,404 A | 10/1987 | Iijima et al. | 430/559 |
| 4,886,341 A | 12/1989 | Oishi et al. | 350/162.22 |
| 5,230,770 A | 7/1993 | Kashiwagi | 156/643 |
| 5,638,355 A * | 6/1997 | Jabr | 369/275.4 |
| 5,721,687 A | 2/1998 | Lamartine et al. | 364/474.08 |
| 5,773,116 A | 6/1998 | Lamartine et al. | 428/64.1 |
| 6,230,071 B1 | 5/2001 | Lamartine | 700/166 |

* cited by examiner

Primary Examiner—Mark A. Robinson
Assistant Examiner—Alessandro V. Amari
(74) Attorney, Agent, or Firm—Samuel L. Borkowsky

(57) ABSTRACT

Reflective diffraction grating. A focused ion beam (FIB) micromilling apparatus is used to store color images in a durable medium by milling away portions of the surface of the medium to produce a reflective diffraction grating with blazed pits. The images are retrieved by exposing the surface of the grating to polychromatic light from a particular incident bearing and observing the light reflected by the surface from specified reception bearing.

11 Claims, 16 Drawing Sheets

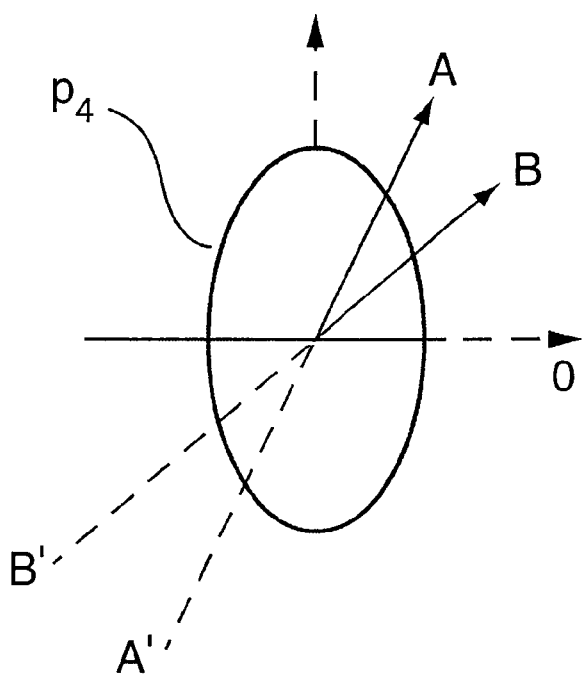
*Fig. 3A*
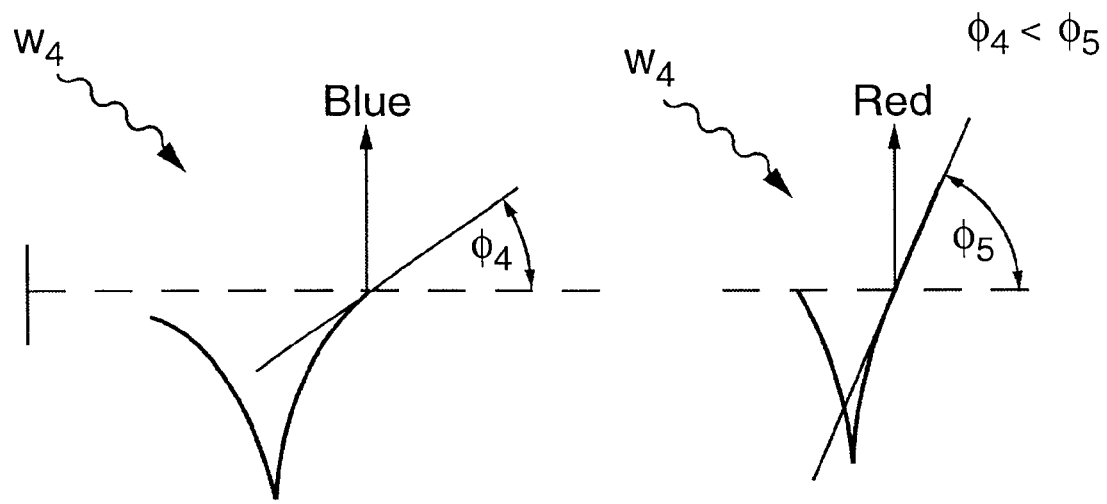
*Fig. 3B*  *Fig. 3C*

$\phi_8 > \phi_9$

US 6,583,933 B2

REFLECTIVE DIFFRACTION GRATING

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to the storage and retrieval of images and more particularly, to a reflective diffraction grating having stored color images that are retrievable using light, and to a method of producing the grating.

BACKGROUND OF THE INVENTION.

Photographic film has been used to store color images for many years. Image resolution for film is limited by the size of the individual grains in the unexposed film, which for the case of three-layer registry of color microfilm is about 10 microns. In addition, film undergoes continuous chemical degradation, which adds to the difficulty in preparing and preserving high-resolution color images.

Other types of media, more durable than film, have also been used to store images. Durable data storage media have, for example, been described in U.S. Pat. No. 5,721,687 to Bruce C. Lamartine et al entitled "Ultrahigh Vacuum Focused Ion Beam Micromill and Articles Therefrom", and in U.S. Pat. No. 5,773,116 to Bruce C. Lamartine et al entitled "Focused Ion Beam Micromilling and Articles Therefrom", both incorporated by reference herein. The durable data storage media are produced by exposing a target substrate to an ion beam under vacuum. The ion beam mills away portions of the substrate surface to form pits. The presence or absence of a pit can be representative of binary characters, i.e. ones or zeros. An aggregate of pits can also be used to form characters that produce images. Greyscale images, for example, may be produced from original black and white images or color images. If the original image was a color image, the color can be recovered from the greyscale image by colorizing, a mathematical reconstruction process that involves using an algorithm to relate the depths of the individual milled pits to color densities of three colors: red, green, and blue. The algorithm assigns a unique color value in a bitmap derived from a table containing the numerical greyscale values used to form the greyscale image.

While colorizing enables the recovery of a color image from a greyscale image stored in durable medium, it is an indirect and complex method. A more direct and less complex method of retrieving color images stored in a durable medium would simplify the retrieval of the stored color images.

Therefore, an object of the present invention is a method of storing color images on a durable storage medium that can be retrieved easily.

Another object of the invention is to provide a durable storage medium having at least one, easily retrievable stored color image.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the present invention includes a method for storing color images in a durable medium. The method involves placing a crystalline or highly polished durable medium having a substantially flat target surface within a vacuum environment; producing a computer data file adapted to operate a computer-controlled, focused ion beam to mill blazed pits into the durable medium; and exposing the durable medium to the computer-controlled ion beam in a vacuum environment, the computer controlled focused ion beam controlled by software utilizing the data file to mill blazed pits into the durable medium, whereby the durable medium is transformed into a durable storage medium with at least one stored color image. When the milled surface of the durable storage medium is exposed to polychromatic light, the stored images can be retrieved.

BRIEF DESCRIPTION OF THE DRAWINGS

The accompanying drawings, which are incorporated in and form a part of the specification, illustrate the embodiment(s) of the present invention and, together with the description, serve to explain the principles of the invention. In the drawings:

FIG. 3a is a top view of an elliptical blazed pit;

FIG. 3b is a cross-sectional view of the pit of FIG. 3a along reception azimuth A'–A;

FIG. 3c is a cross-sectional view of the pit of FIG. 3a along reception azimuth B'–B;

13a), to an angle of 75 degrees (FIG. 13b), to an angle of 85 degrees (FIG. 13c) and finally to an angle of 90 degrees (FIG. 13d), which shows the recovered image of the girl.

DETAILED DESCRIPTION OF THE INVENTION

The present invention includes a type of durable storage medium referred to herein as a "reflective diffraction grating". The grating has stored color images that are retrievable using polychromatic light. The invention also includes a method of producing the grating. The invention also includes a color image storage and retrieval system used to produce the grating and to view the images stored by the grating. The storage and retrieval system includes: (1) a computer-controlled focused ion beam (FIB) milling apparatus programmed to mill blazed pits of a predetermined orientation and eccentricity into a durable medium; (2) a crystalline or highly polished, substantially flat, durable medium that is transformed into the reflective diffraction grating by milling the pits into the durable medium; (3) a light source, preferably a collimated one, for illuminating the grating; and (4) a multiocular microscope for viewing the stored images.

The gratings of the present invention are durable storage media produced by milling blazed pits into durable media. Durable media that may be used to produce reflective diffraction gratings of the present invention are crystalline or highly polished solids capable of being micromilled by an FIB micromilling apparatus under a vacuum generally less than about $10^{-7}$ torr. Durable media that may be used include, but are not limited to, diamond, diamond-like carbon, (DLC), graphite, nickel, chromium, titanium, platinum, copper, gold, aluminum, aluminum oxide, and silicon, to name a few. Other solid materials may also be used as durable media.

Figure 1A:
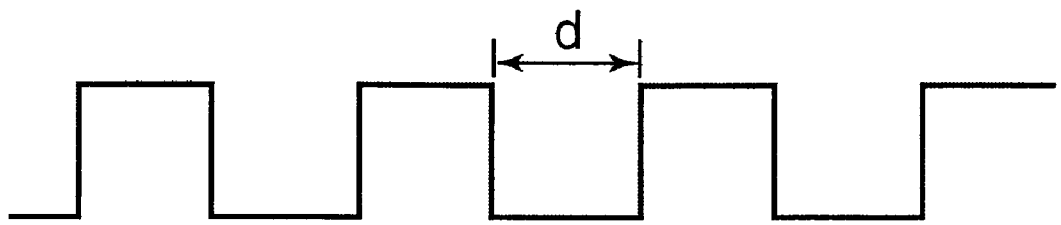
FIG. 1a is a schematic cross-sectional view of a non-blazed diffraction grating.
Figure 1B:
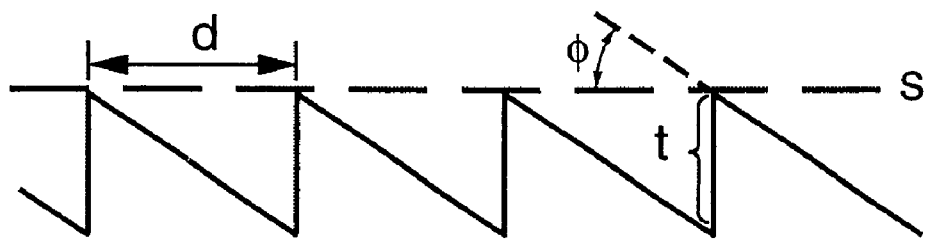
FIG. 1b is a schematic cross-sectional view of a blazed grating according to the prior art.

The invention will be understood in greater detail by referring to the accompanying FIGS. Similar or identical structure is identified using identical callouts. FIGS. 1a and 1b show schematic cross-sectional views of conventional line diffraction gratings. The grating of FIG. 1a has a rectangular cross-section and a uniform spacing "d". FIG. 1b shows a blazed grating having a uniform spacing "d", a depth "t" measured from the surface plane "s" of the substrate, and a blaze angle "$\phi$" measured relative to surface plane "s". Line diffraction gratings of uniform spacing, depth, and blaze angle are known to reflect, diffract, and disperse polychromatic light into its individual wavelengths.

The reflective diffraction grating of the present invention is not a grating of uniformly spaced lines, but instead is a grating of blazed pits of predetermined sizes, shapes, relative orientations, and locations on the grating. These parameters are chosen to provide the color images stored by the grating. The color images are retrieved by illuminating the surface of the grating with polychromatic light, preferably from a collimated light source. The light is directed toward the grating surface along a particular incident elevation and incident azimuth, herein referred to as an "incident bearing". The grating reflects selected bands of the incident light along a particular reception azimuth and reception elevation, herein referred to as a "reception bearing".

Figure 2:
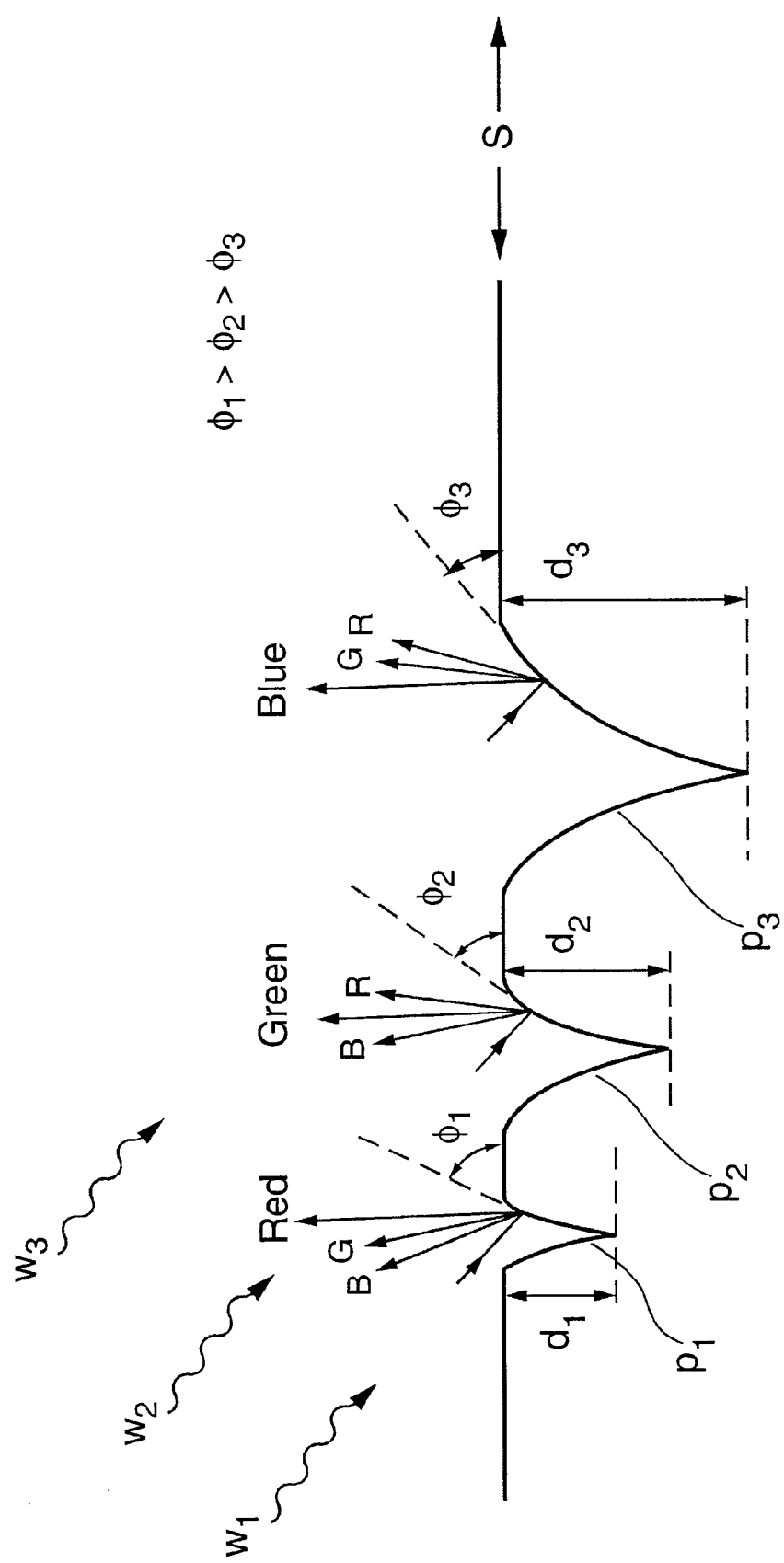
FIG. 2 is a schematic cross-sectional view of three milled pits from a blazed grating of the present invention.

FIG. 2 provides a schematic cross-sectional view of a grating surface of the present invention, which shows the surfaces of three adjacent, blazed pits $p_1$, $p_2$, and $p_3$. For this surface, an identical beam spot, i.e. one having the same eccentricity and orientation on the surface of the durable medium, was used to mill blazed pits $p_1$, $p_2$, and $p_3$. As FIG. 2 shows, each pit has been milled to a different depth. Pit $p_1$ has depth $d_1$, pit $p_2$ has depth $d_2$, and pit $p_3$ has depth $d_3$. The pit depths vary in proportion to the total milling time for a particular pit. The milling time is referred to herein as the "dwell time", the, total milling time equal to the total dwell time for a particular pit. Of the three pits shown in FIG. 2, the shortest dwell time resulted in the production of the shallowest pit, the longest dwell time produced the deepest pit, $p_3$, and an intermediate dwell time $d_2$ resulted in pit $p_2$, which is deeper than $p_1$ but shallower than $p_2$.

FIG. 2 also illustrates another aspect of the invention, namely that the blaze angle along a particular bearing varies with the dwell time of the ion beam. Pit $p_1$, the pit milled with the shortest dwell time for example has the largest blaze angle $\phi_1$ along the incident bearing shown. Pit $p_3$ milled with the longest dwell time has the smallest blaze angle $\phi_2$, and pit $p_2$ milled with an intermediate dwell time has a blaze $\phi_3$ that is correspondingly intermediate in size between $\phi_1$ and $\phi_3$ along the same incident bearing.

FIG. 2 also shows how parallel light rays of polychromatic light are separated into their component colors. Parallel rays $W_1$, $W_2$, and $W_3$ of collimated polychromatic light are directed at pits $p_1$, $p_2$, and $p_3$, respectively, along the same incident bearing, i.e. along the same incident azimuth and incident angle of elevation. The grating diffracts the incident light. For the range of reception bearings where reflected colors of light are viewable, each pit produces a different color of light when viewed along the same reception bearing. For the reception bearing with a reception angle of elevation of about 90 degrees relative to the grating surface 's', the colors shown in FIG. 2 are represented as red for pit $p_1$, green for pit $p_2$, and blue for pit $p_3$. Also shown are other colors produced by pits $p_1$, $p_2$, and $p_3$. As FIG. 2 shows, these other colors are reflected along different reception bearings. Pit $p_1$, for example, reflects red light along the 90-degree reception bearing; pit $p_1$ also reflects green light and blue light, but reflects these wavelengths along a different reception bearing. Since green light and blue light are not reflected along the 90-degree reception bearing for pit $p_1$, green light and blue light are not viewable along this reception bearing. They would, however, be viewable along their own reception bearings.

FIGS. 3a–c shows schematically how a single blazed pit provides a plurality of effective blaze angles according to the reception azimuth. FIG. 3a shows a top view of an elliptical pit, $p_4$, and indicates two reception azimuths labeled A'–A and B'–B along which light is reflected when the pit is illuminated by polychromatic light. FIG. 3b shows the cross-section of the elliptical pit along azimuth A'–A and indicates that this cross-section provides a blaze angle $\phi_4$ that is encountered by the incident light. FIG. 3c shows the cross-section of the elliptical pit along azimuth B'–B and shows that this cross-section provides a different blaze angle $\phi_5$ for the incident light. Polychromatic light ray $W_4$ reflected along azimuth A' to A will be of one color, e.g. red light, while light ray $W_4$ reflected along azimuth B'–B would be of a different color, e.g. blue light.

Figure 4A:
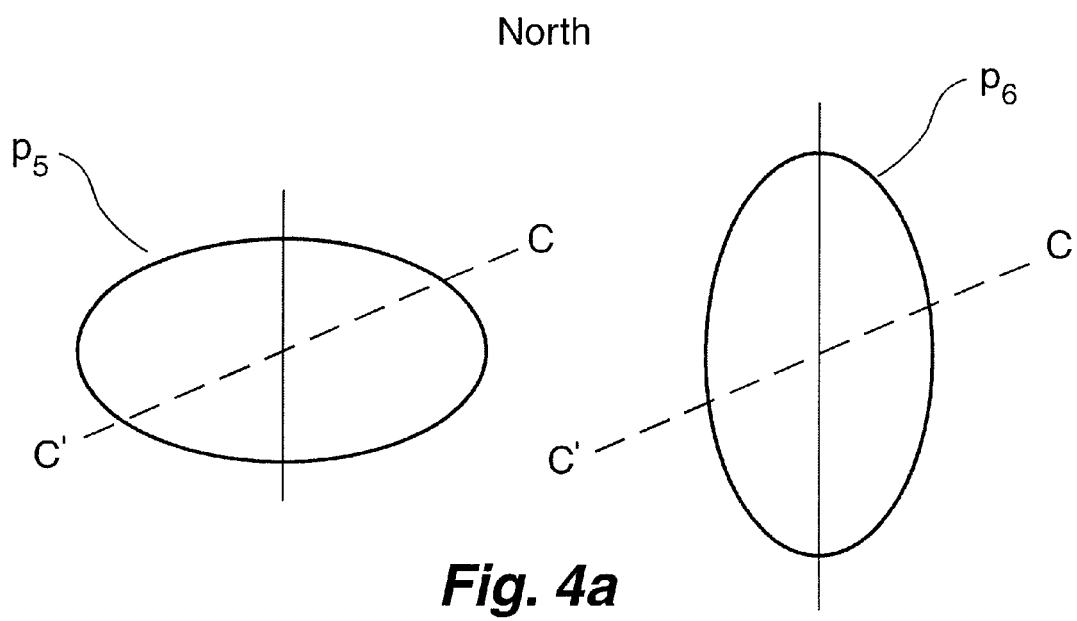
FIG. 4a is a top view of two adjacent elliptical pits having different relative orientations.
Figure 4B:
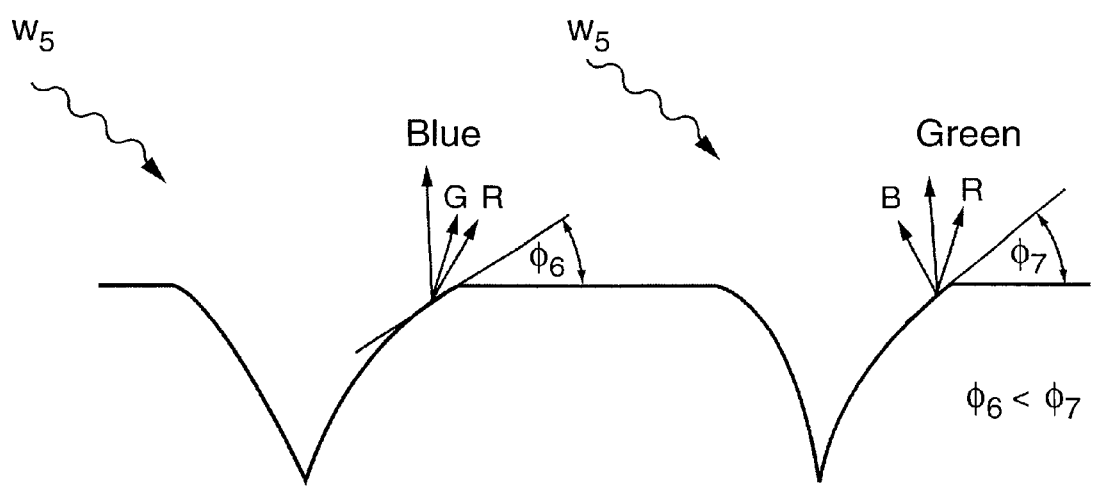
FIG. 4b is a cross-sectional view of the pits FIG. 4a along reception azimuth C'–C.

FIGS. 4a–b illustrate how different colors of light result from two elliptical pit $p_6$ and $p_7$, which have the same eccentricity but differ in their relative orientation in a grating. Any relative orientation is possible but for convenience, the major axis of pit $p_6$ coincides with the minor axis of pit $p_7$. FIG. 4a shows top views of pit $p_6$ and $p_7$, with identical reception azimuth C'–C. Along this azimuth, pit $p_6$ provides an effective blaze angle $\phi_6$ while pit $p_7$ provides a different blaze angle $\phi_7$. Reflected light viewed along a reflection angle of 90 degrees relative to the grating surface 's' will be, e.g. blue light for pit $p_6$ and green light for pit $p_7$.

Figure 5A:
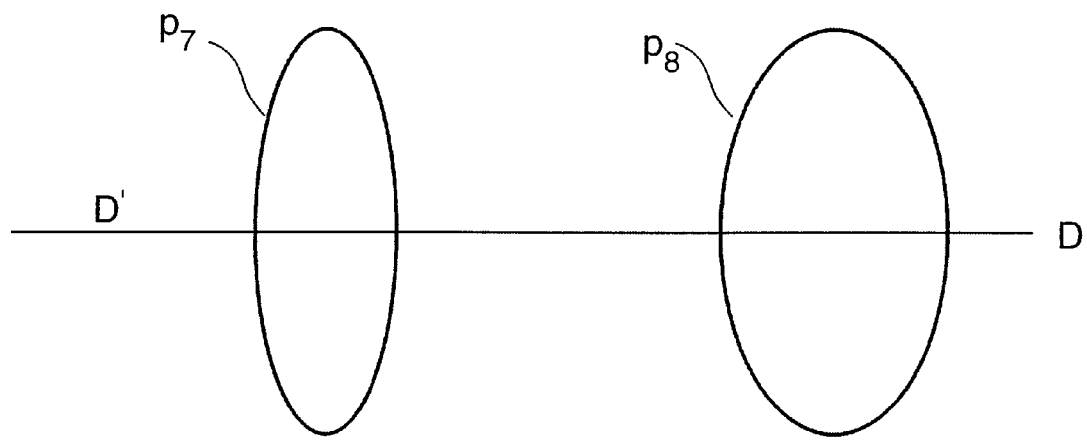
FIG. 5a is a top view of two adjacent pits varying in eccentricity.
Figure 5B:
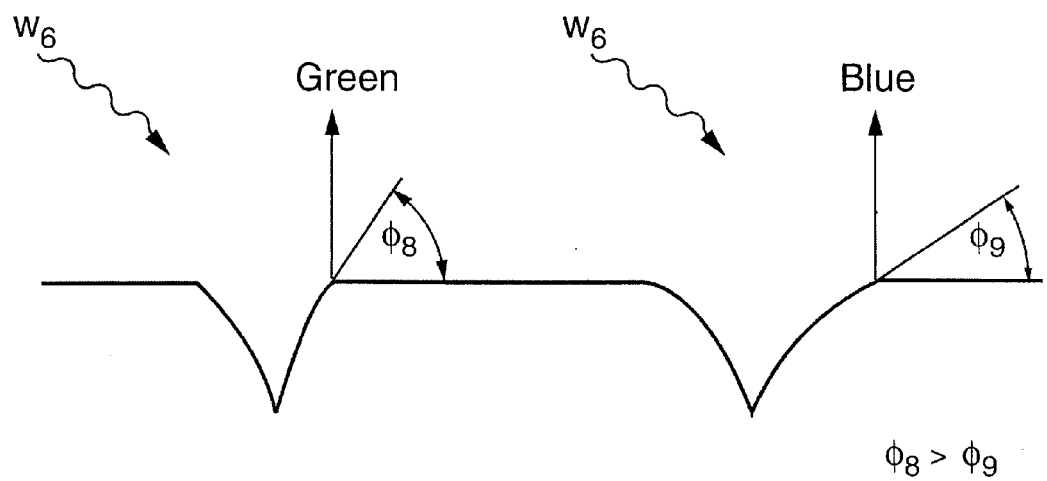
FIG. 5b is a cross-sectional view of the pits of FIG. 5a along reception azimuth D'–D.

FIGS. 5a–b illustrate how different colors of light result-from two pits, $p_7$ and $p_8$, that are milled with the same depths, i.e. with the same dwell time, but with different eccentricities. FIG. 5a shows top views of two pits, $p_7$ and $p_8$ having the same orientation on a grating surface. As FIG. 5a shows, the eccentricity of pit $p_7$ is larger than that for pit $p_8$. FIG. 5b shows cross sections of pit $p_7$ and pit $p_8$ on azimuth, D'-D. As FIG. 5b shows, the more eccentric pit $p_7$ provides the larger blaze angle along D'-D. Thus, when polychromatic light ray $W_6$ is incident upon these pits, light reflected form pit $p_7$ will be one color along a 90 degree reception bearing, e.g. green light, while light reflected from pit $p_8$ will be another color, e.g. blue light, along the same reception bearing.

The ion beam used with the present invention is a focused ion beam. It can be focused according to a variety of beam profiles, where a beam profile describes the current density of the beam across a beam spot. Typically the current density is highest in the center of the beam spot and decreases outwardly from the center to the edges of the spot. Where the ion beam current density is highest at the center of the beam, and the milled depth is a maximum at the center of the pit. As the current density decreases outwardly from the center, the milled depth decreases proportionally. Focused ion beam profiles that can be used to provide gratings of the present invention include Lorentzian beam profiles and Gaussian beam profiles.

Figure 6:
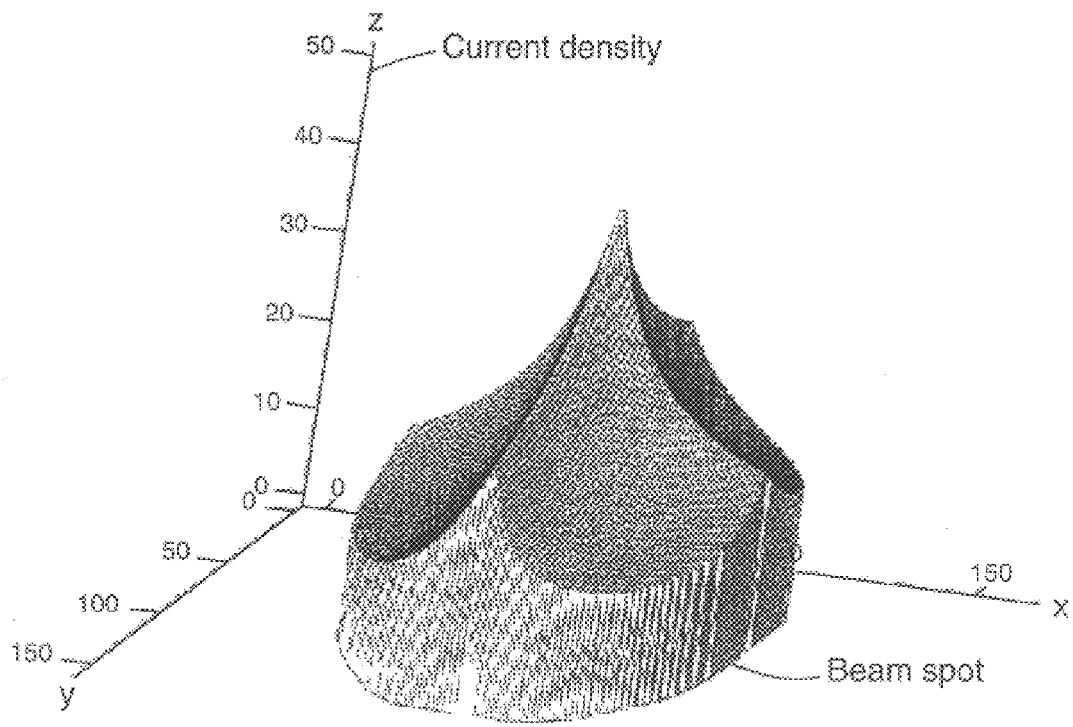
FIG. 6 is a beam profile of a mathematically generated blazed pit with an involute elliptical shape.

FIG. 6 shows a perspective view of a 3-dimensional representation of the major portion of a Lorentzian beam profile for an elliptical beam spot. The profile is plotted as current density along the vertical axis and shows the current density at a maximum at the center of a beam spot and how it decreases according to a Lorentzian function from the center of the spot towards the periphery.

Figure 7:
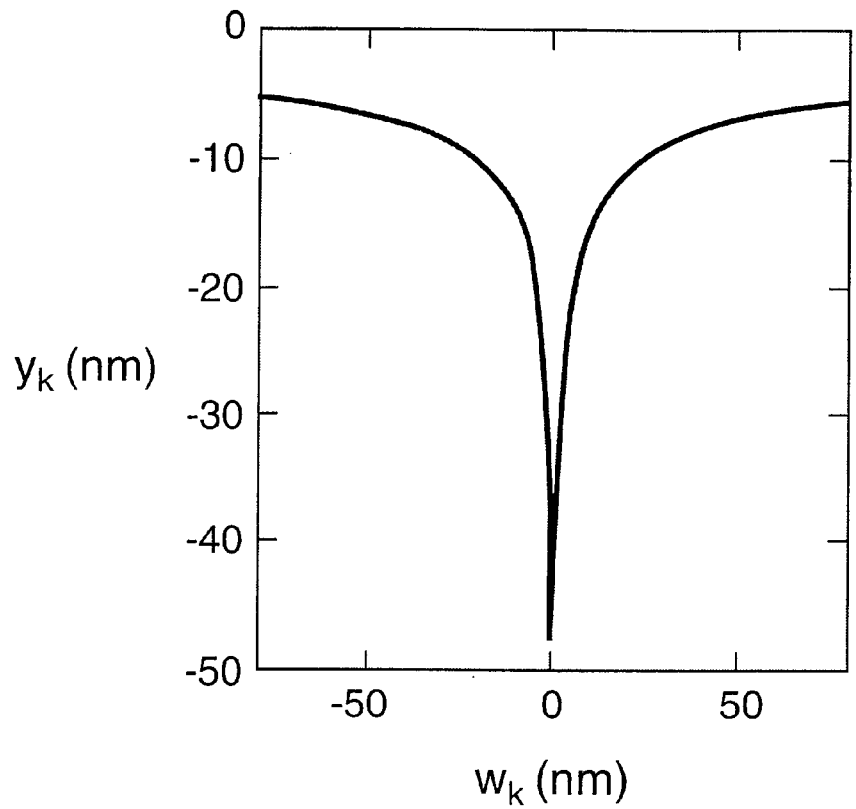
FIG. 7 is a graph of the angular distribution of the beam profile of FIG. 6.

FIG. 7 shows a cross-section along the minor axis, i.e. across the xz plane passing through the center of the pit of FIG. 6. FIG. 7 expresses this cross-section as milled depth, $y_k$ in nanometers (nm) versus $w_k$ in nm, the distance away from the center of the pit. The pit is deepest at the center where the current density of the beam was highest, and decreases across the beam spot toward the periphery. The cross-section of the Lorentzian beam profile of FIG. 7 is described mathematically by the following equations, where the parameters of each equation are defined and listed below.

$y_k = [-2\beta(\sigma(2\pi)^{1/2})^{-1}](1+|w_k|)^{-0.5}$, $y_k$ being the pit depth expressed as a function of the distance, $w_k$, from the center of the pit;

$w_k = -N$ to $+N$, the full-width of the pit varying from (−) 80 nm to (+) 80 nm for a full width of 160 nm;

where $\sigma = 10$ nm; $\beta = 600$, a scalar; n=8, a scalar; N=n$\sigma$=80 nm=the half-width of the beam spot;

$x_i = 1$ n $\sigma$ i $N^{-1}$, values of the half-width along the w-axis; i=0 . . . N;

$\xi_i = x_i - \max(x)$, a parameter for identifying the negative values of the width;

w=stack($\xi$, x), all the values of the width;

M=rows(w), the total number of values of the width;

k=1 . . . M−1, the index with a maximum value of M−1;

$z_k = (y_k - y_{k-1})(w_k - w_{k-1})^{-1}$, the differential of pit depth at each pit width, i.e. the slope at every position along the surface of cross-section of the pit; and $\phi_k = \arctan(z_k)$ in degrees, the blaze angle at a particular position on the surface of this cross-section of the pit.

According to the cross-section shown in FIG. 7, the blazed pit has a maximum pit depth at the center of about 45 nanometers (nm) and a maximum cross-sectional width of about 140 nm across the xz plane passing though the center of the pit.

Figure 8:
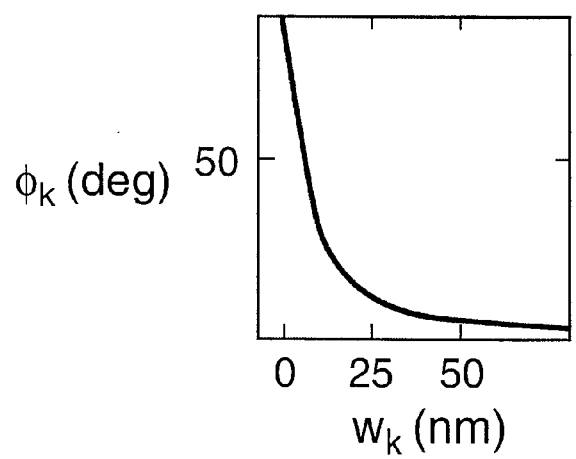
FIG. 8 is a plot of blaze angle vs. milled depth for the beam profile of FIG. 6.

FIG. 8 shows a portion of the curve of the arctangent of the derivative of FIG. 7, expressed as $\phi_k$, the blaze angle, as a function of $w_k$, the distance away from the pit center. As FIG. 8 shows, the blaze angle $\phi_k$ is a maximum at $w_k$ equal to zero, i.e. at the center of the pit. At a distance of about 10 nm from the center, the pit provides a blaze angle of about 50 degrees.

An equation that mathematically describes the surface of a pit milled with the aforementioned Lorentzian beam profile is shown below, along with relevant parameters.

Figure 9A:
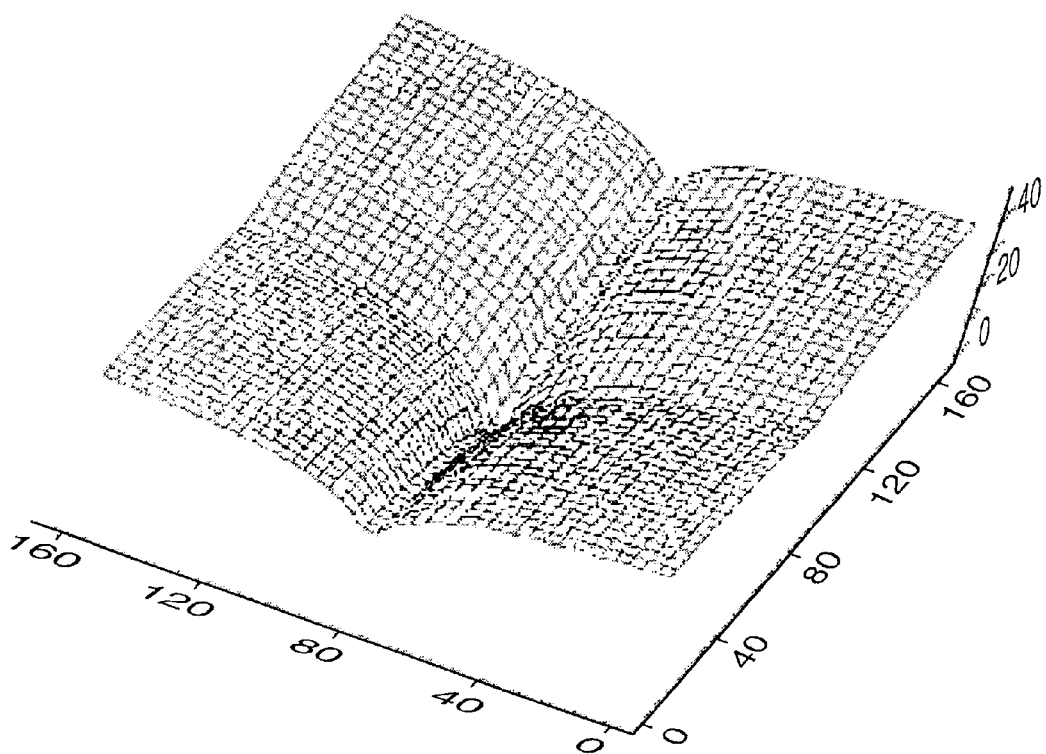
FIGS. 9a–d show perspective views of mathematically generated surfaces of a blazed pit.
Figure 9B:
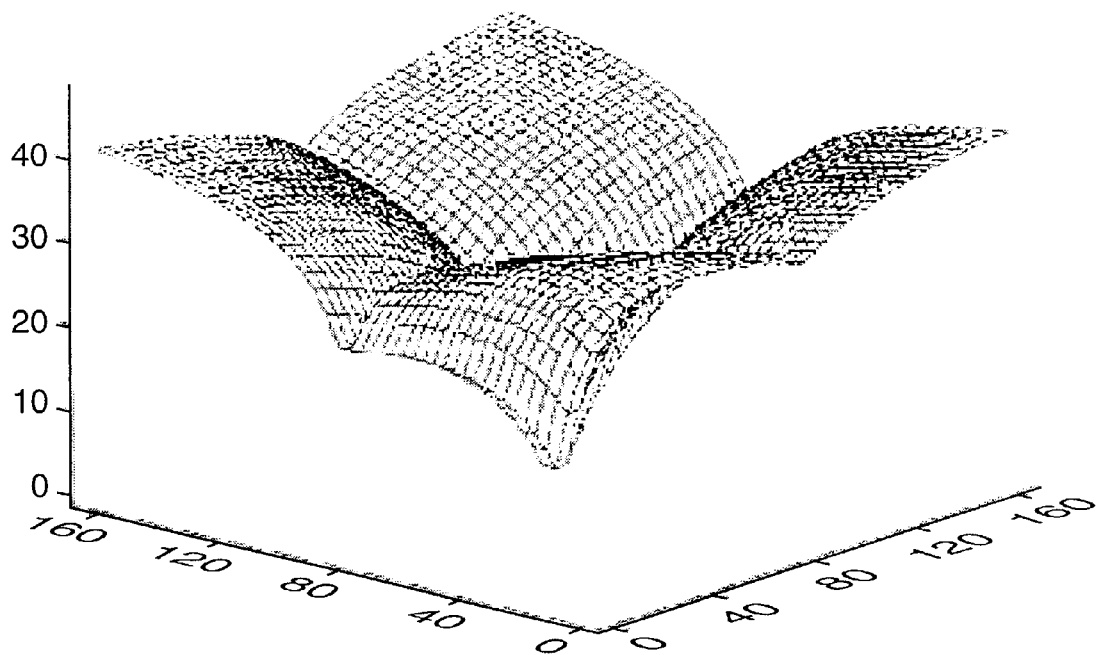
Figure 9C:
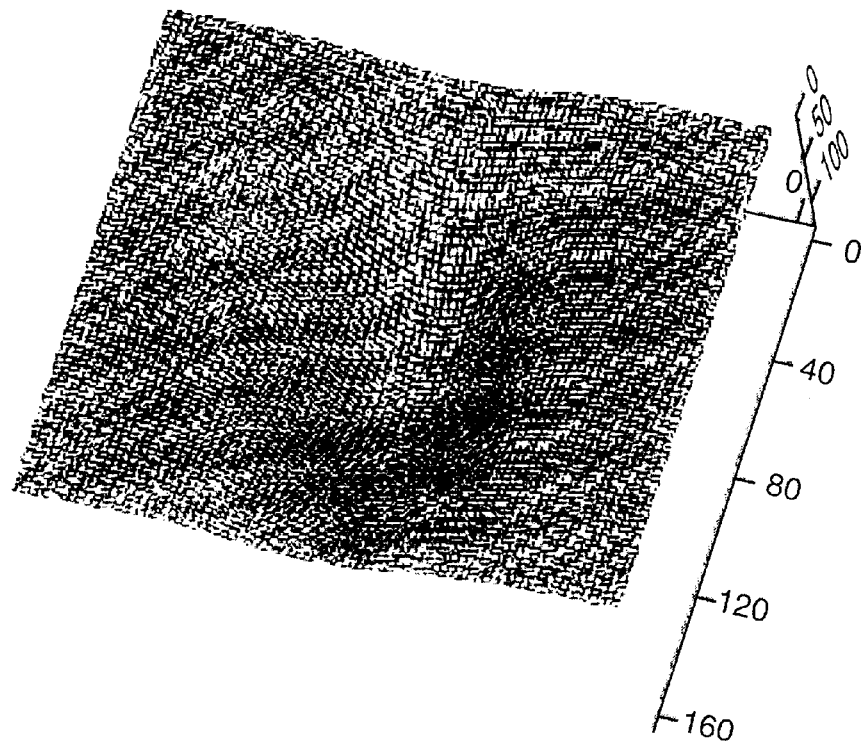
Figure 9D:
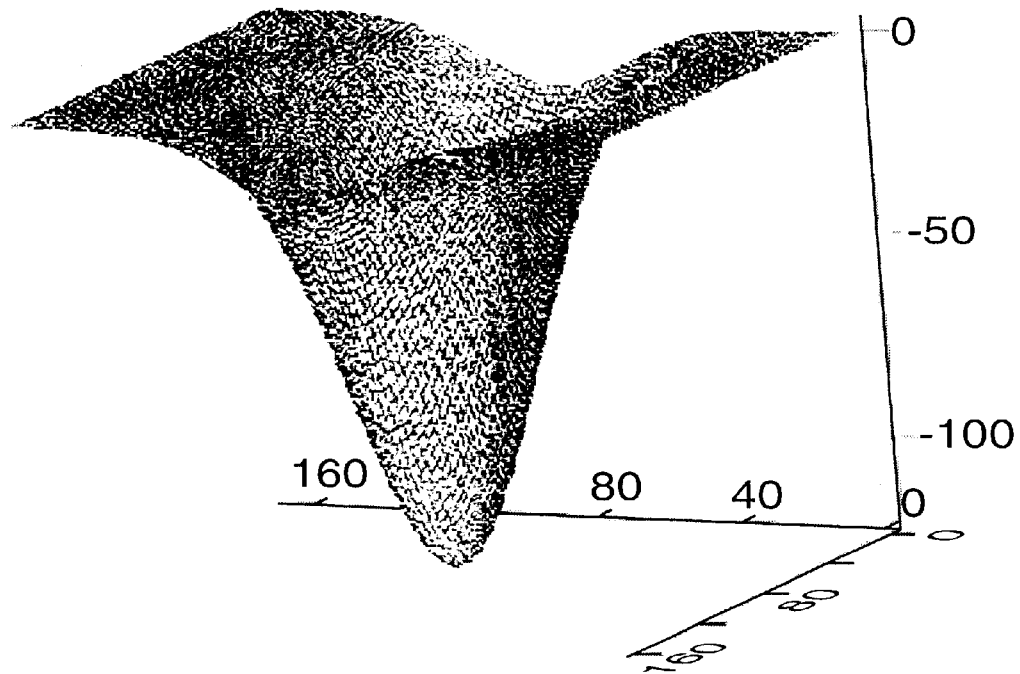

$V_{j,k} = [-2\beta(\sigma(2\pi)^{1/2})^{-1}](1+\epsilon1|w_k|)^{-0.5}(1+\epsilon2|w_j|)^{-0.5}$, where $V_{j,k}$ is the depth as a function of $w_k$ and $w_j$, the distances from the center of the pit, for all points along the surface of the pit; where $\epsilon1$ is a scalar set equal to 0.15, $\epsilon2$ is a scalar set equal to 0.03; and j=0 . . . M−1. FIG. 9a and FIG. 9b show perspective views of representations of the resulting 3-dimensional pit surfaces. For comparison, FIG. 9c and FIG. 9d show perspective views of representations of a blazed pit milled using a Gaussian profile.

Figure 10:
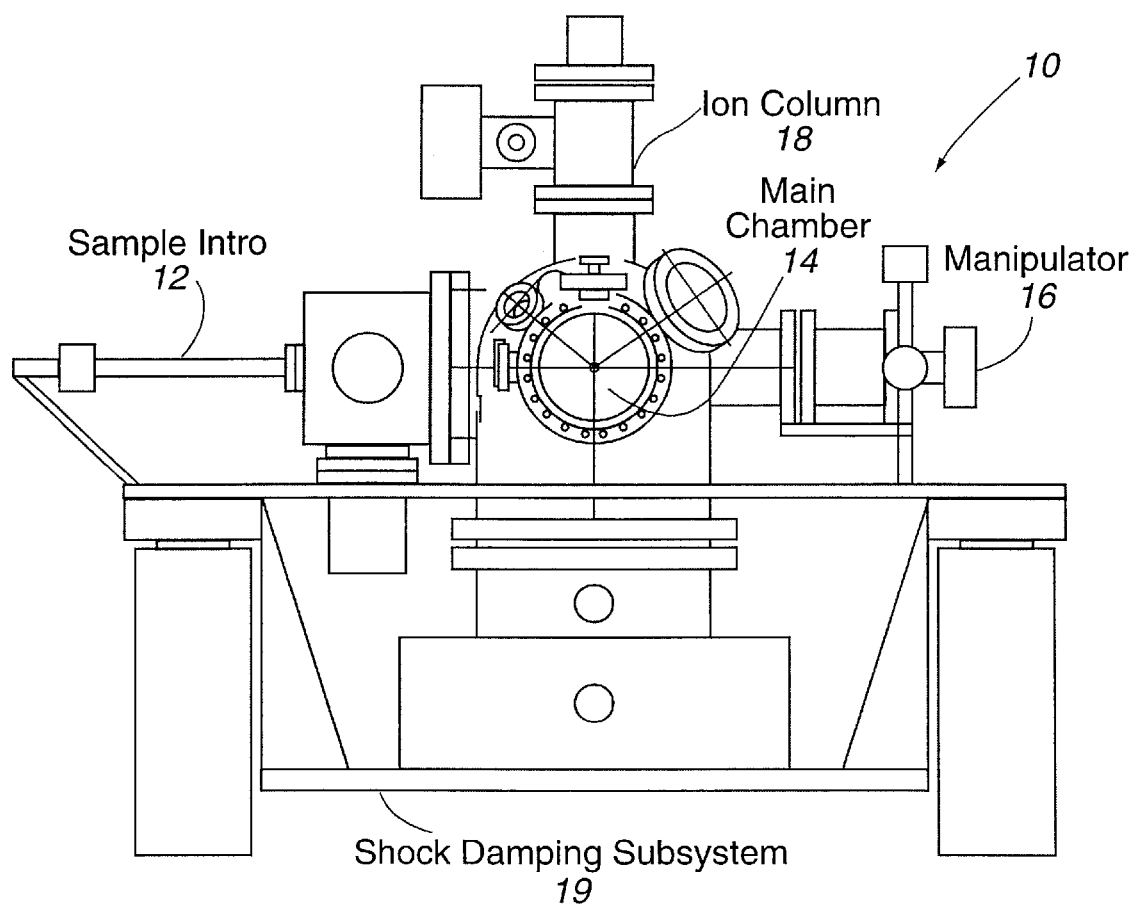
FIG. 10 is side view of a focused ion beam micromilling apparatus.

FIG. 10 shows a schematic representation of the FIB micromilling apparatus used with the present invention. The description of this FIB micromilling apparatus can be found in aforementioned U.S. Pat. No. 5,721,687 and U.S. Pat. No. 5,773,116 and also in U.S. Pat. No. 6,230,071 to B. C. Lamartine, hereby incorporated by reference for all purposes. Apparatus 10 includes a sample introduction portion 12 for introducing a durable medium into the main chamber 14, and a manipulator 16 for manipulating the durable medium. Apparatus 10 also includes an ion column 18 that produces the focused ion beam that mills blazed pits into the durable medium. Apparatus 10 also includes a shock dampening subsystem 19 to minimize any vibration that could affect the micromilling process.

Figure 11:
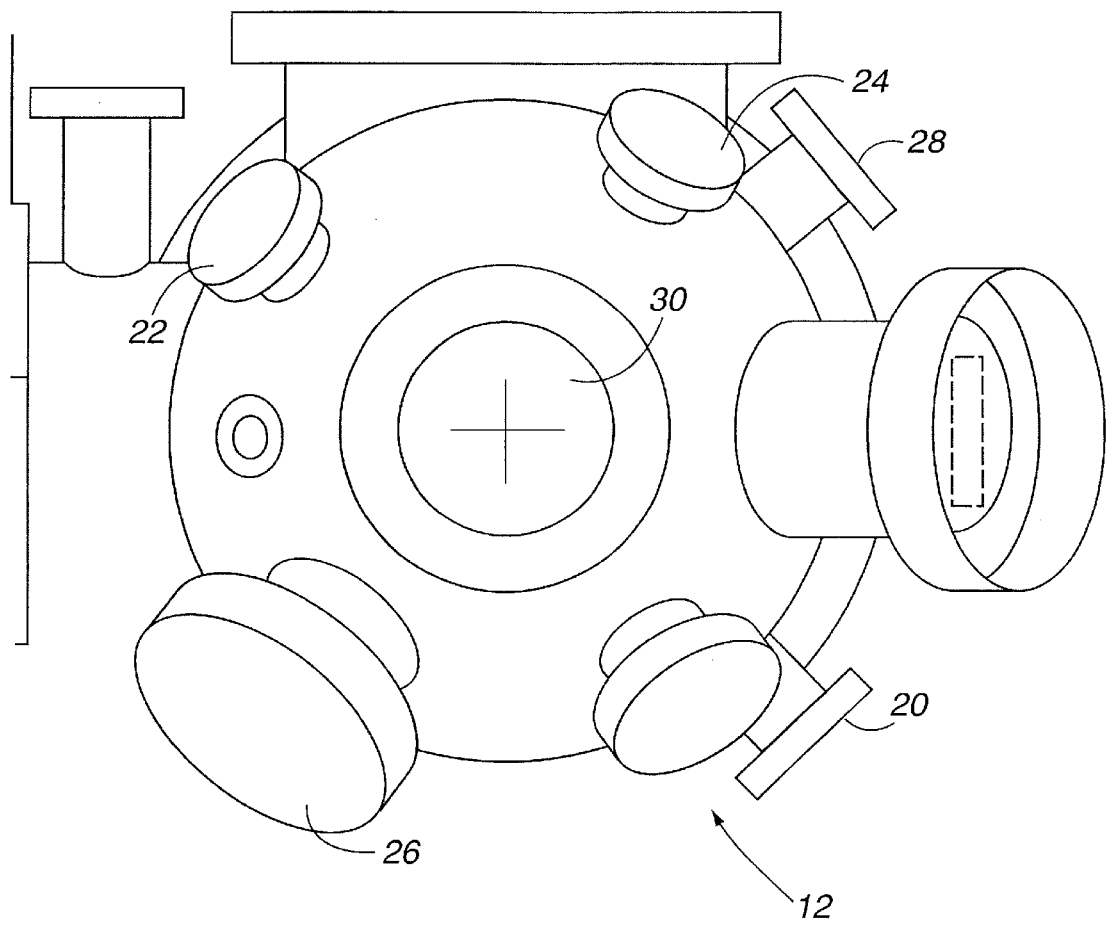
FIG. 11 is a top view of a vacuum chamber of an ion beam micromilling apparatus.

FIG. 11 shows a top view of vacuum chamber 12, which includes a number of viewing ports for viewing the grating as it is being milled, for filming it, for inserting or manipulating it, and for various analyses including, for example, secondary electron emission. Port 20 can be a view port with port 22 being used for a camera port. Other view ports 24 and 26 are shown as is a roughing pump port 28. Port 30 contains the software-driven ion beam gun. Multiple ion beams may be used if desired.

Figure 12:
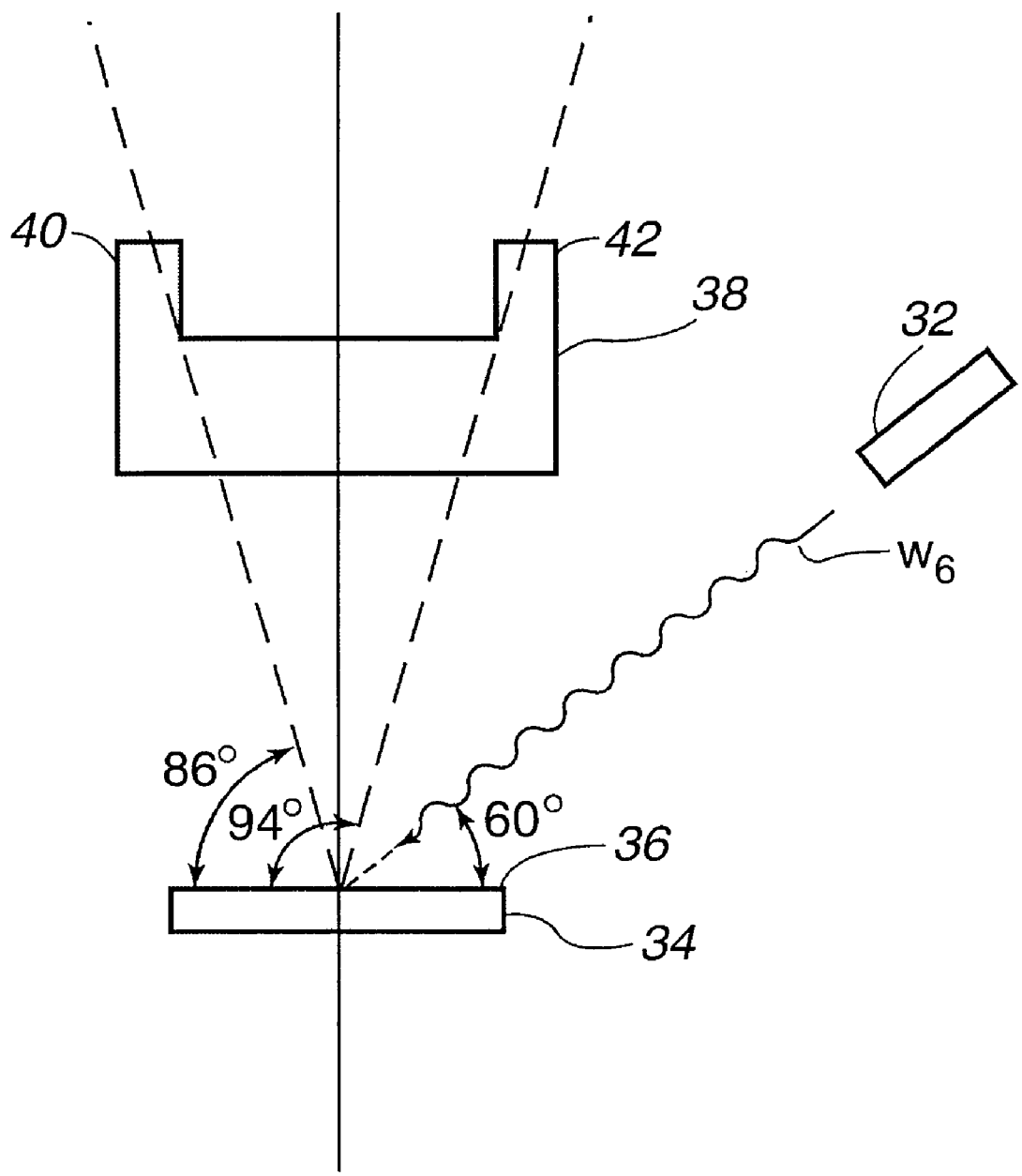
FIG. 12 is schematic view of an image retrieval system in the process of retrieving a stored image from a grating of the present invention.

FIG. 12 shows one configuration of the image retrieval portion of the image storage and retrieval system used to retrieve stored images from a grating. Other configurations are possible. As FIG. 12 shows, collimated light ray $W_6$ from polychromatic light source 32 is directed at the grating 34 at an incident angle of elevation of about 60 degrees measured from the grating surface 36. Binocular microscope 38 is positioned for viewing the image stored by the grating such that the reception angle of elevation for the left eyepiece 40 and right eyepiece 42 of microscope 38 are about 86 and about 94 degrees, respectively, relative to grating surface 36.

By manipulating various adjustable milling parameters of the FIB micromilling apparatus, a pit having the desired shape is produced. The commercially available FIB micromilling apparatus models EVA and 2LI, available from the FEI Company, both use electrostatic columns to control the shape of the beam spot. The x and y stigmator voltages of these columns are adjustable to produce a beam spot with a desired eccentricity. For the above mentioned micromilling apparatus models, there are 4 individual voltage plates for adjusting the x stigmator voltage, and 4 voltage plates for adjusting the y-stigmator voltage. A spherical focus voltage is applied near the stigmator plates. To produce an elliptical beam spot, the x-stigmator voltages are adjusted to a value slightly greater than, or less than, the y-stigmator voltages. For instance, an elliptical beam spot having a major axis along the y-axis and a minor axis along the x-axis is produced by setting the x-stigmator voltages equal to 1.03 times the spherical focus voltage while setting the y-stigmator voltage at 0.97 times the spherical voltage. FIB micromilling apparatus models XL 200 and model 800 also from the FEI Company, include software that generates the stigmator voltages required for a particular beam spot eccentricity.

All of the FIB instruments above operate under computer control to direct the ion beam to particular locations on the durable medium for a chosen dwell time. The beam mills away surface portions and produces a blazed pit. The milling of a particular pit is typically done in stages called "frames". The purpose for milling in frames is twofold: first, milling in frames prevents the redeposition of material already milled away so that the desired pit shape is the one actually produced. Second, milling in frames allows for a gradual shaping of blazed pits to produce the desired colors. Milling a particular pit to give a light red color when illuminated with polychromatic light, for example, requires a relatively short dwell time. If the pit is milled for additional dwell time, the pit is transformed into one that gives darker red. Additional milling transforms the pit into one that provides orange; additional milling provides yellow; additional milling provides green; additional milling transforms the pit into one that provides blue; and further milling provides violet when the pit is illuminated with polychromatic light.

Figure 13A:
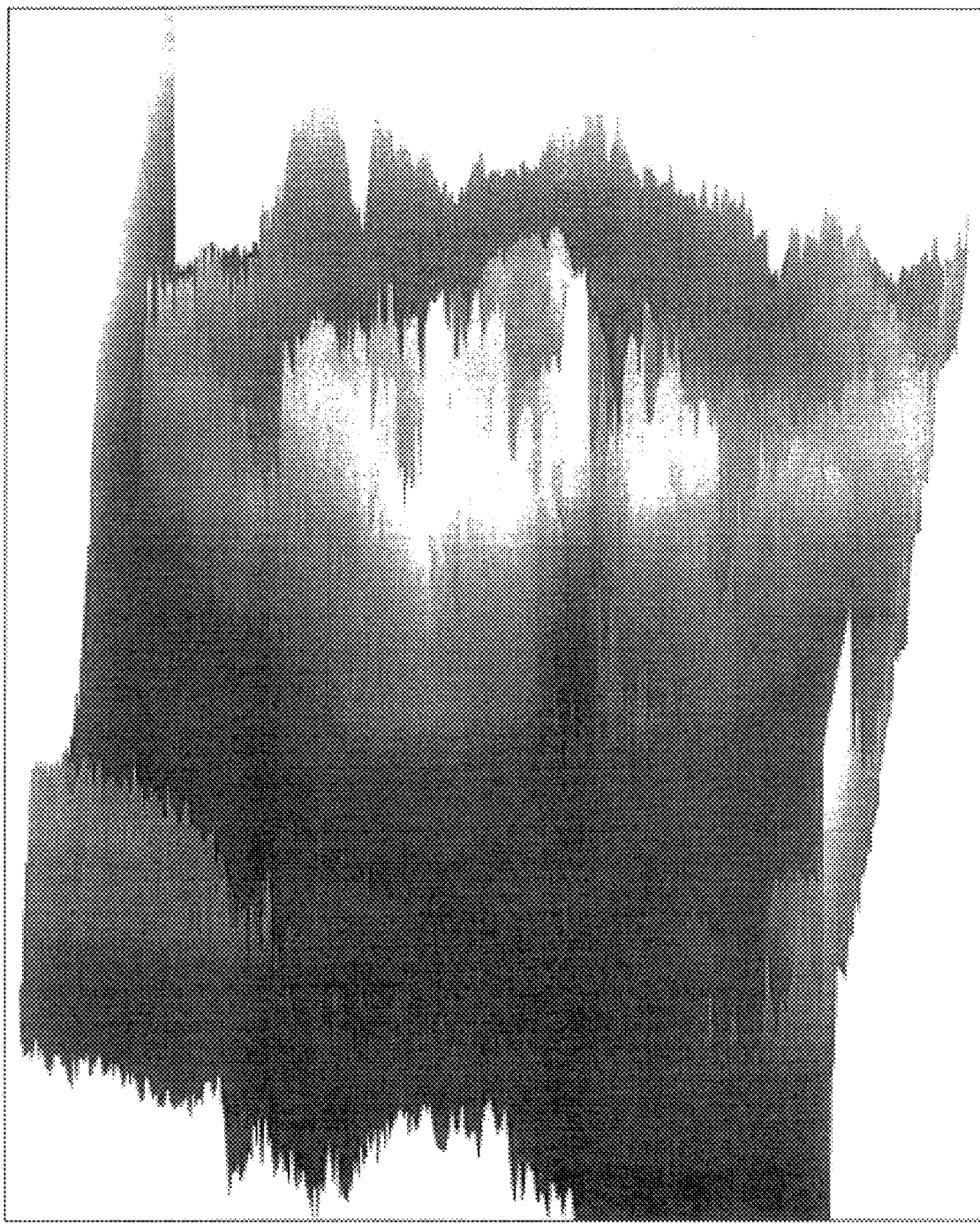
FIGS. 13a–d show how the image of a young girl stored in a grating of the invention comes into view using incident polychromatic light as the reception bearing moves from an angle of 50 degrees relative to the grating surface (FIG.
Figure 13B:
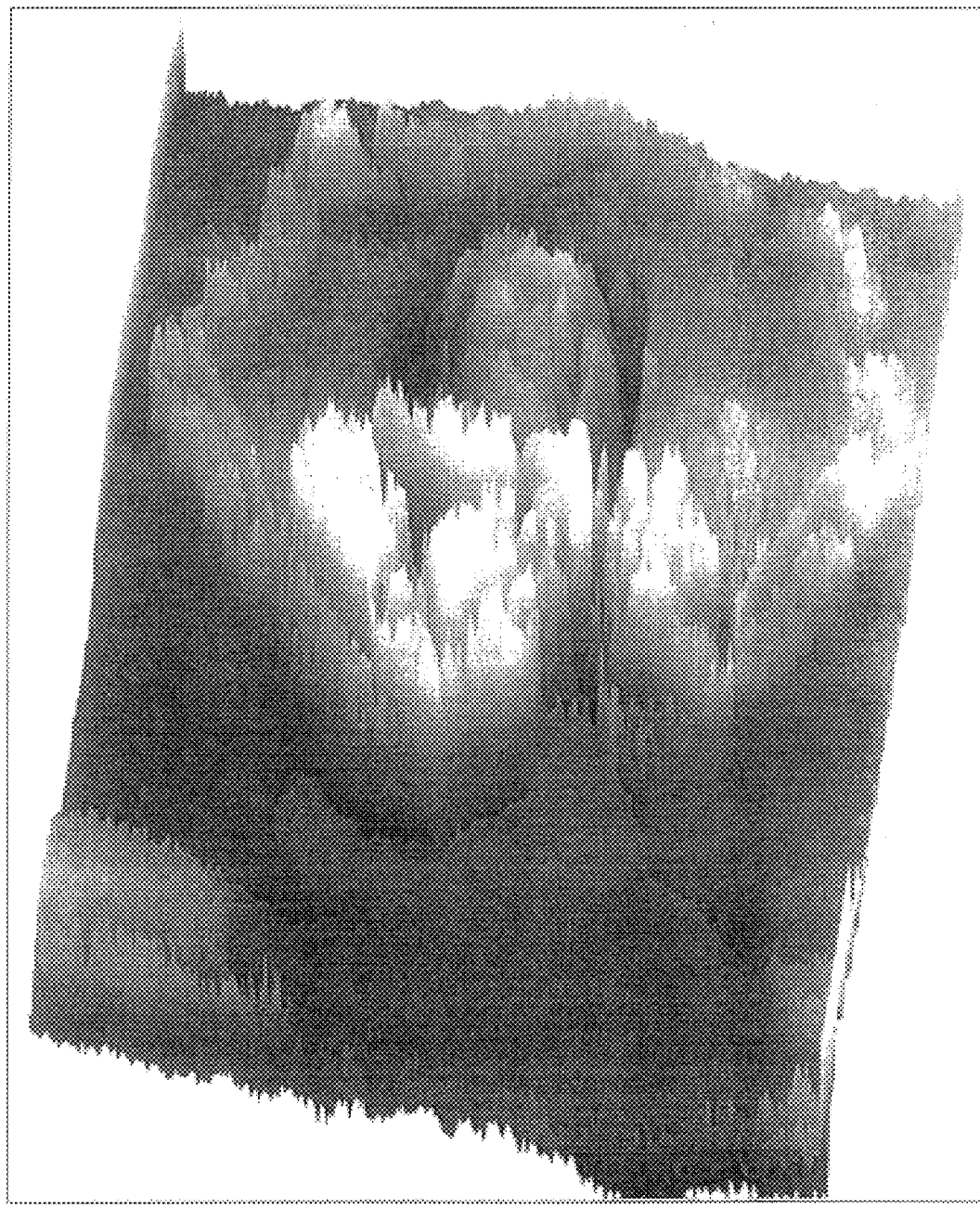
Figure 13C:
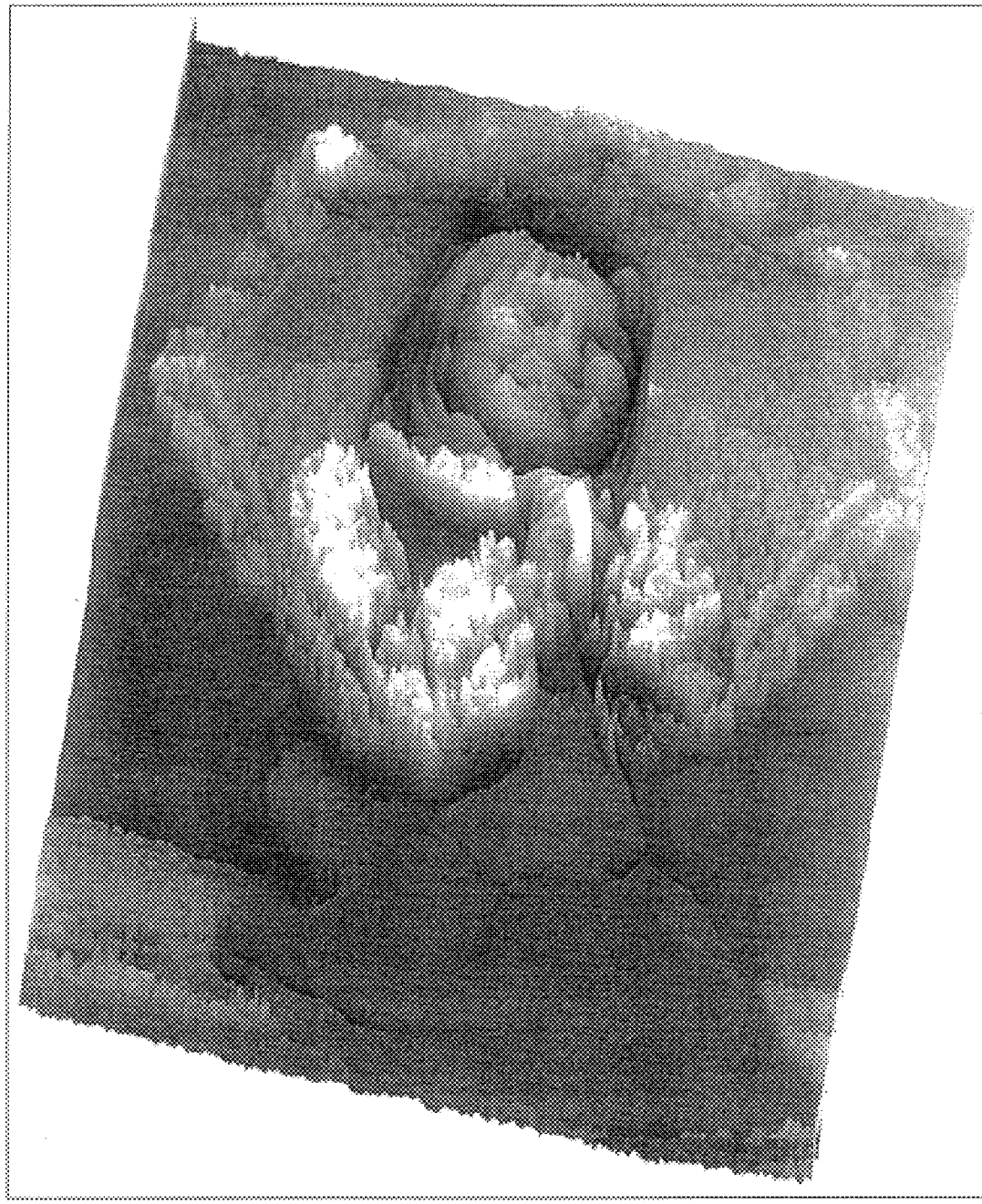
Figure 13D:
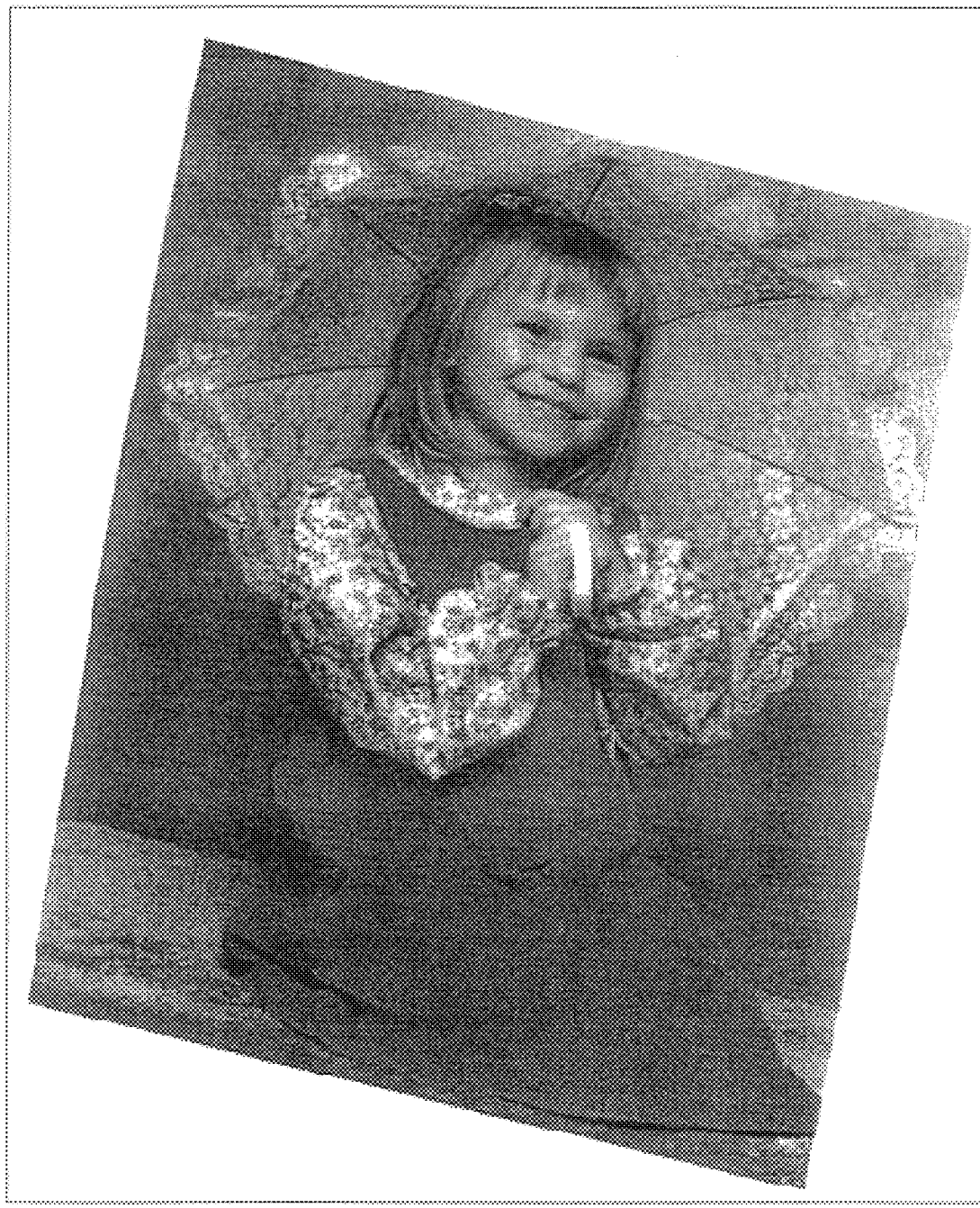

The invention was used to transfer a color image of a young girl, in print form, to a stored image of the girl in a durable medium to form a grating of the present invention. FIGS. 13a–c show how the image comes into view using incident polychromatic light as the reception bearing moves from an angle of 50 degrees relative to the grating surface (FIG. 13a), to an angle of 75 degrees (FIG. 13b), to an angle of 85 degrees (FIG. 13c). The recovered image of the girl, shown in FIG. 13d, can be viewed at a reception bearing of 90 degrees relative to the grating surface. While FIGS. 13a–c correspond to reception bearings that to do not produce the color image, the milled, pitted surface structure can be more easily seen. A description of how the image was transferred to a durable storage medium to form a grating now follows. First, a color image of the girl was converted into digital image data in the form of a bitmap file, a large array of numbers, by electronically scanning a color photograph of the image with a high-resolution color scanner. Each number of the bitmap file defines the color at a particular location of the image. The bitmap file was converted into three smaller arrays, the first containing numerical data relating to those portions of the image having a red color, the second containing data related to the green portions of the image, and the third containing data related to the blue portions of the image.

The software included with the FIB apparatus could not read color bitmap files directly. Therefore, two software programs were written in order to translate a color bitmap file into files readable by the FIB apparatus. The first program, called Bmprn1.mcd, is shown directly below. It was written for the Mathcad environment, and converts each of the three smaller arrays into three intermediate files with the filenames of the form xxx.prn.

This program was written by B.C. Lamartine. It has been given the name Bmprn1.mcd. The program reads a bitmap file that contains numerical values,each value representing a color. The bitmap file is an (N+1) by (M+1) array. The program creates dwell time values from the bitmap file. Each dwell time value corresponds to a particular color in the bitmap file. The program also creates a xxx.prn file from the bitmap file. The program is executable in Mathcad 6.0 and higher versions. It is read one line at a time from left to right. The underlined text below describes the operation performed by each line in the program.

| | |
|---|---|
| Identify the input and output filenames and define them as variables: | bitmap := "F:\Winmcad\nor1208b.bmp"   output := "F:\Winmcad\nor1208b.prn" |
| Read each value of the bitmap file and invert, i.e., subtract from the maximumvalue of 255 | T1 := 255 − READBMP(bitmap) |
| Define the row and column indices: | N := rows(T1) − 1   M := cols(T1) − 1   i := 0 . . . N   j := 0 . . . M |
| Set the Digital to Analog Converter (DAC) spacing (Span) between adjacent pit locations: | Span := 4   Npoints := (N + 1) · (M + 1)   Npoints = ∎ |
| Create an X array and a Y array of integer DAC values for each point: | $X_{i,j} := \text{floor}\left[\left[i - \left(\frac{N+1}{2}\right)\right] \cdot \text{Span} + 2047\right]$   $Y_{i,j} := \text{floor}\left[\left[j - \left(\frac{M+1}{2}\right)\right] \cdot \text{Span} + 2047\right]$ |
| Scale the dwell times for each of the color separated bitmaps: | red := 1.0   green := 1.857   blue := 3.143 |
| Create a T array of dwell times for each point (green shown): | $T_{i,j} := \text{floor}(\text{green} \cdot T1_{i,j})$ |
| Transpose the X, Y, and T arrays: | $XT := X^T$   $YT := Y^T$   $TT := T^T$ |

Having created X, Y, and T arrays and transposed them, they now must be put into a form readable by the file translator program PRNSTR7, written by B. C. Lamartine in BASIC. Briefly, the X, Y, and T arrays are -continued concatenated by columns, i.e. each of the three (N + 1) × (M + 1) arrays is translated into a vector, i.e. a one-dimensional 1 × (Npoints) array, and the resulting x, y, and t vectors are recombined to form a three-dimensional 3 × (Npoints) array that can be read by PRNSTR7.

| Declare the concatenation function: | $\text{Unwrap}(M) := \begin{vmatrix} V \leftarrow M^{(0)} \\ \text{for } i \in 1 \ldots \text{cols}(M) - 1 \quad \text{if cols}(M) > 1 \\ \quad V \leftarrow \text{stack}(V, M^{(i)}) \\ V \end{vmatrix}$ |
|---|---|
| Concatenate columns in each array to form three long vectors: | x := Unwrap(XT)    y := Unwrap(YT)    t := Unwrap(TT) |
| Form an array of the three vectors: | WUV := augment(augment(t, y), x) |
| Save the array as an output file in a format that can be processed by PRNSTR7: | PRNCOLWIDTH := 1    PRNPRECISION = 4    WRITEPRN(output) := WUV |

The second program, called PRNSTR7, was written in BASIC and converts each of the three intermediate files having filenames xxx.prn into three data files called 'millstream files' having filenames xxx.str. The millstream files can be read and rapidly processed by the computer that controls the FIB apparatus. A millstream file has the following form:

s
nf
np
t[1]x[1]y[1]
t[i]x[i]y[i], where

The first three lines of the millstream file are entries s, nf, and np, which are collectively known as the millstream header, where 's' is the three-dimensional mode designator; nf is the number of frame repetitions; and np is the total number of lines of data. The number of lines of data is also equal to the number of pits to be milled into the durable medium. Further, 'i' is an index that varies from 1 to np; t[i] is the beam dwell time in nanoseconds; x[i] is the horizontal position in digital-to-analog converter units (0-4095); and y[i] is the vertical position in digital-to-analog converter units (0-4095). The total time the beam spends milling a particular pit is equal to the dwell time 't[i]' multiplied by the number of frames specified in the millstream header 'nf'.

The intermediate xxx.prn files generated using the first program are left justified and only a single space separates t, x, y values. Subsequent file processing by PRNSTR7, the BASIC program below, includes the removal of any minus signs, a left registry shift, and the attachment of the appropriate header.

```
        $CPU 80286
100     CLS:SCREEN 9
        SCREEN 12: COLOR 14, 9
        PRINT
        PRINT"_____PRNSTR7 by BRUCE C. LAMARTINE,_____"
        PRINT"_____LOS ALAMOS NATIONAL LABORATORY, 03/09/98, rev 05/20/98____"
        PRINT"                                                  rev 10/30/99____"
        PRINT"          This program reads a MATHCAD XXX.PRN file"
        PRINT"          and produces an FEI Millstream file XXX.STR"
        PRINT"          This version writes only those t,x,y lines"
        PRINT"          having nonzero dwell time. XXX.STR may be graphed."
        PRINT
        PRINT"          Data of the form:"
        PRINT
        PRINT"          aaa bbbb cccc         become"
        PRINT"          aaa bbbb cccc         behind a millstream header"
        PRINT
        PRINT"_____"
        PRINT"          CAUTION !!! Existing XXX.STR files will be overwritten."
        PRINT"_____"
        PRINT
        INPUT"    Continue? (y/n)", GO$
        IF GO$ = "n" OR GO$ = "N" THEN GOTO 1000
        PRINT"          Enter a MATHCAD source path and filename (no extension):"
        INPUT"          (e.g., c:\winmcad\xxx)"; FILEN$
        PRINT"          Enter a target path:"
        INPUT"          (e.g., f:\stream\xxx)"; DRIVE$
```

-continued

```
            CLS:PRINT
            FILENM$ = FILEN$ + ".PRN"
            FILENMTMP$ = FILEN$ + ".TMP":
            MILLSTR$ = DRIVE$ + ".STR": PRINT"   ";FILENM$;"----->";MILLSTR$
            PRINT
            PRINT"   Note: Only the nonzero dwell data sets will be counted."
            PRINT
            INPUT"   Continue? (y/n)", GO$
            IF GO$ = "n" OR GO$ = "N" THEN GOTO 1000
            PRINT
            INPUT"   Total # of frames? (100000)", NFRAMES$
            PRINT"                                                              "
            ON TIMER(1) GOSUB 2000
            TIMER ON
            T = TIMER
            OPEN FILENM$ FOR INPUT AS #1
            OPEN FILENMTMP$ FOR OUTPUT AS #2
            CTR=0
            LPTM=0
200         DO UNTIL EOF(1)
            LINE INPUT #1, LI$
            IF LEFT$(LI$,2) = "0" THEN GOTO 200
            LIN$ = RIGHT$(LI$, LEN(LI$) - 1)
            PRINT #2, LIN$
            CTR=CTR+1
            LPTM=LPTM+VAL(LIN$)
            LOOP
            CLOSE #1
            CLOSE #2
            OPEN FILENMTMP$ FOR INPUT AS #2
            OPEN MILLSTR$ FOR OUTPUT AS #3
            STRID$ = "s"
            PRINT #3, STRID$
            PRINT #3, NFRAMES$
            NPOINTS$ = LTRIM$(STR$(CTR))
            PRINT #3, NPOINTS$
            DO UNTIL EOF(2)
            LINE INPUT #2, STRLN$
            PRINT #3, STRLN$
            LOOP
            TIMER OFF
            DONE$ = MILLSTR$ + "Complete"
            PRINT
            LOCATE 10, 30
            PRINT DONE$
            SOUND 1200,1
            SOUND 1400,1
            SOUND 1600,1
            CLOSE #2
            CLOSE #3
            SHELL "cd\stream"
            TMPDEL$ = "del" + FILEN$ + ".tmp"
            SHELL TMPDEL$
            SHELL "cd\pb"
            PRINT
            PRINT "              # of t,x,y data sets =", CTR
            PRTS = LPTM*(VAL(NFRAMES$)/10000000)
            PRTH = PRTS/3600.0
            H=INT(PRTH)
            H$= LTRIM$(STR$(H))
            PRTM =(PRTH – H)*60.0
            M=INT(PRTM)
            M$=LTRIM$(STR$(M))
            IF LEN(M$)<2 THEN M$="0"+M$
            PRTSEC = (PRTM – M)*60.0
            S=INT(PRTSEC)
            S$=LTRIM$(STR$(S))
            IF LEN (S$)<2 THEN S$="0"+S$
            PRT$=H$+":"+M$+":"+S$
            PRINT"              Pattern run time =", PRT$
            INPUT"              DIAPLAY GRAPH? (y/n)", GR$
            IF GR$ ="y" OR GR$ = "Y" THEN GOSUB 4000
900         INPUT"              Do another? (y/n)", G$
            IF G$ = "n" OR G$ = "N" THEN GOTO 1000
            GOTO 1000
1000        END
2000        REM ELAPSED TIME SUBROUTINE
            TNEW = TIMER
```

-continued

```
            TELAPSED = INT(TNEW – T)
            LOCATE 8, 47
            PRINT "Time (sec) ="; TELAPSED
            RETURN
4000    REM Display subroutine
4010    CLS
            SCREEN 9
            SCREEN 12
            COLOR 14,8
            PRINT"           Choose a plot color scheme:"
            INPUT"          (0 = single; 1 --> 15; increasing # of colors)"; NC$
            PRINT
            PRINT"          Choose offset (use 0 unless plot was black)"
            INPUT"          (0 ---> 15; Increases offset                    "; OF$
            OF = VAL(OF$)
            IF OF>15 THEN OF=15
            NC = VAL(NC$)
            IF NC>15 THEN NC=15
            CLS:PRINT
            GOSUB 5000
            LOCATE 1,1
            INPUT"          Replot same file? (y/n)"; RP$
            IF RP$ = "y" OR RP$ = "Y" THEN GOTO 4010
            LOCATE 1,1
            INPUT"                              Do another? (y/n)", GO$
            IF GO$ = "y" OR GO$ = "Y" THEN GOTO 100
4020    RETURN
5000    REM GRAPHIC DISPLAY SUBROUTINE
            CLS
            SCREEN 12
            COLOR 14,0
            WINDOW (0,0) - (4095,4095)
            VIEW (80,20) - (535,475), 0 ,14
            LOCATE 3, 16
            PRINT "Span =";NC$;"            Offset =";OF$
            REM Redefine input variable millstr$
            OPEN MILLSTR$ FOR INPUT AS #1
            LCT=0
            DO UNTIL EOF(1)
5020    LINE INPUT #1, LIM$
            LCT=LCT+1
            IF LCT<4 GOTO 5020
            DT=VAL(LIM$)
            DTV=INT(10*(((DT*(NC+1))/2048)-(INT((DT*(NC+1))/2048)))) + OF + 1
            IF DTV>15 THEN DTV=15
            DT$=LTRIM$(STR$(DT))
            XYDAC$=REMOVE$(LIM$, DT$+" ")
            XDAC=VAL(XYDAC$)
            XDAC$=LTRIM$(STR$(XDAC))
            YDAC$=REMOVE$(XYDAC$,XDAC$+" ")
            YDAC=VAL(YDAC$)
            IF YDAC>4095 THEN YDAC=4095
            IF XDAC>4095 THEN XDAC=4095
            PSET(XDAC,4095-YDAC), DTV
            LOOP
            CLOSE #1
            RETURN
```

Alternatively, any text editor package can be used to convert files as the above program PRNSTR7 does. Convenient packages include the "Find and Replace" features of Microsoft Word for Windows, Version 2.0. Typically, the "find" operation can locate, for example, "–" and the "replace all" operation can be used to convert it to "0". The left registry shift can then be accomplished automatically. Then, the processed file can be stored as xxx.txt and finally, the millstream header is attached to the xxx.txt file and stored as xxx.str, a file compatible with FEI CO. Ionmill software Version 2.5.

The present grating invention can store multiple color images in the same region of the grating. Multiple image storage is possible by adjusting the blaze angles of the milled pits so that a first image is produced for a first set of incident and reception bearings, while a second image is produced for a second set of incident and reception bearings. By appropriate variations in the eccentricity and dwell time of the focused ion beam, a pit is produced that reflects light along first reception bearing for a first blaze angle, and also reflects light along a second reception bearing from a second blaze angle selected independently from the first blaze angle, even if the second reception bearing has the same elevation as the first reception bearing. The light reflected along the first bearing produces one image, and the light reflected along the second bearing produces a different image.

The FIB is used to mill blazed pits into a medium with a substantially flat surface. Preferably, the ion beam is normal to the surface as the milling proceeds. The ion beam can also be directed at the surface from a direction other than normal, but the resulting pits have a more limited range of useful reception bearings.

The present invention is often described herein with reference to polychromatic light that includes various colors of light in the visible region. The milling can be scaled to create blazed pits for light of wavelengths other than visible, e.g. infrared, ultraviolet, etc. and still provide the wavelength separation necessary to maintain faithful records of the original image. In this way, as new light sources and detection abilities are developed, the art of analog color storage or, more generally, analog light wavelength-dependent storage, can be extended to even higher density capabilities than those described herein.

The invention provides various improvements over known image storing methods and media. The stored color images of the present invention can be more directly retrieved from the grating of the invention than images stored that require a subsequent colorizing process. In contrast to prior art gratings, the color of light reflected to a reception bearing from the present grating can be adjusted on a pit by pit basis by adjusting the eccentricity, dwell time and orientation. Thus, the wavelength dispersion of the present grating is adjustable over the entire surface of the grating. The invention is also superior in various ways to storing color images on photographic film. First, the FIB micromilling apparatus can be controlled to a precision such that the stored images of the invention have a higher resolution than images stored on film. Next, while emulsion color film continuously deteriorates, the present grating invention does not. Furthermore, while color film is typically used to record only a single polychromatic image in a particular region of the film, the present invention provides a grating with multiple stored images in the same region of the grating.

In summary, a computer controlled FIB is used to mill blazed pits into a target substrate to produce a reflective diffraction grating. This provides a robust medium for storing colored images. When an incident polychromatic, preferably collimated, light source is directed at the grating, the pits diffract and directionally disperse the light into individual wavelengths. The grating reflects the diffracted light to an optical detector (e.g. a microscope, a CCD detector, and the like) that can be used to view the stored color images. By varying the eccentricity and/or orientation of any blazed pit, the grating of the invention can provide one particular blaze angle along one reception azimuth, and a different blaze angle along a different azimuth. By adjusting the orientation and eccentricity of the blazed pits, a single grating is capable of storing a plurality of color images, each image being retrievable by illuminating the grating with polychromatic light along a different reception azimuth. As with conventional diffraction gratings, collodion or other conformal replicate materials may be used to create inexpensive copies from the milled diffraction grating.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of storing at least one color image in a durable medium, comprising the steps of:
    (a) placing a crystalline or highly polished durable medium having a substantially flat target surface within a vacuum environment;
    (b) producing a computer data file adapted to operate a computer-controlled, focused ion beam to form an elliptical beam spot on the target surface to mill elliptical, blazed pits into the durable medium; and
    (c) exposing the target surface of the durable medium to the ion beam, the ion beam being controlled by software utilizing the computer data file, whereby elliptical blazed pits are milled into the durable medium at predetermined locations, thereby transforming the durable medium into a durable storage medium having at least one stored color image retrievable by illuminating the durable storage medium with polychromatic light.

2. The method of claim 1, wherein the eccentricity, orientation, and dwell time of the ion beam are controlled to adjust the blaze angle of the blazed pits along at least one reception bearing.

3. A method of storing at least one color image in a durable medium and retrieving the image, comprising the steps of:
    (a) placing a crystalline or highly polished durable medium having a substantially flat target surface within a vacuum environment;
    (b) producing a computer data file adapted to operate a computer-controlled, focused ion beam to mill blazed pits into the durable medium;
    (c) exposing the target surface of the durable medium to the computer-controlled ion beam, the ion beam being controlled by software utilizing the computer data file, whereby elliptical blazed pits are milled into the durable medium at predetermined locations, thereby transforming the durable medium into a durable storage medium having at least one stored color image retrievable by illuminating the durable storage medium with polychromatic light;
    (d) exposing the durable storage medium to polychromatic light along an incident bearing, whereby the polychromatic light is diffracted by the grating and dispersed into its component wavelengths, the wavelengths being reflected by the durable storage medium along a plurality of reception bearings; and
    (e) retrieving the at least one stored color image by positioning an optical detector along at least one of the reception bearings to detect the diffracted light reflected by the durable storage medium.

4. The method of claim 3, wherein the eccentricity, orientation, and dwell time of the ion beam are controlled to adjust the blaze angle of the blazed pits along at least one reception bearing.

5. The method of claim 3, wherein the optical detector comprises a microscope, a telescope, or a CCD detector.

6. A durable storage medium having at least one stored color image, the durable storage medium made by the method comprising the steps of:
    (a) placing a crystalline or highly polished durable medium having a substantially flat target surface within a vacuum environment;
    (b) producing a computer data file adapted to operate a computer-controlled, focused ion beam to form a milled substrate; and
    (c) exposing the surface of the durable medium to the computer-controlled ion beam, ion beam being controlled by software utilizing the computer data file, whereby elliptical blazed pits are milled into the durable medium at predetermined locations, thereby transforming the durable medium into a durable storage medium having at least one stored color image retrievable by illuminating the durable storage medium with polychromatic light.

7. The durable storage medium of claim 6, wherein the eccentricity, orientation, and dwell time of the ion beam are controlled to adjust the blaze angle of the blazed pits along at least one reception bearing.

8. A directional-color microimaging apparatus, comprising:

(a) a crystalline or highly polished durable medium having a substantially flat target surface;

(b) a vacuum chamber for receiving said durable medium;

(c) a computer-controlled, focused ion beam apparatus having a vacuum chamber for receiving said durable medium, said ion beam apparatus capable of producing an ion beam that provides an elliptically shaped beam spot on said target surface of said durable medium; and (d) a computer data file adapted to operate the computer-controlled, focused ion beam to mill blazed pits into the target surface of said durable medium at predetermined locations, thereby transforming the target substrate into a durable storage medium with at least one stored color image.

9. The apparatus of claim 8, wherein the eccentricity, orientation, and dwell time of the ion beam are controlled to adjust the blaze angle of the blazed pits along at least one reception bearing.

10. A directional color image retrieving apparatus, comprising:

(a) a durable storage medium having at least one stored color image, said storage medium produced by placing a crystalline or highly polished durable medium having a substantially flat target surface within a vacuum environment, producing a computer data file adapted to operate a computer-controlled, focused ion beam to form a milled substrate, and exposing the surface of the durable medium to the computer-controlled ion beam, ion beam being controlled by software utilizing the computer data file, whereby elliptical blazed pits are milled into the durable medium at predetermined locations, thereby transforming the durable medium into a durable storage medium;

(b) a collimated polychromatic light source for illuminating the durable storage medium; and (c) an image viewed for viewing the color images produced when the light source illuminates the durable storage medium.

11. The apparatus of claim 10, wherein the eccentricity, orientation, and dwell time of the ion beam are controlled to adjust the blaze angle of the blazed pits along at least one reception bearing.

* * * * *